United States Patent
Paul (10) Patent No.: US 7,746,219 B1
(45) Date of Patent: Jun. 29, 2010

(54) METHOD AND APPARATUS FOR ADJUSTING TRAILER ELECTRICAL LOAD LIMITS

(75) Inventor: David J. Paul, Canton, MI (US)

(73) Assignee: Yazaki North America, Canton, MI (US)

( * ) Notice: Subject to any disclaimer, the term of this patent is extended or adjusted under 35 U.S.C. 154(b) by 288 days.

(21) Appl. No.: 12/099,608

(22) Filed: Apr. 8, 2008

(51) Int. Cl.
G08B 21/00 (2006.01)

(52) U.S. Cl. .................................................. 340/431

(58) Field of Classification Search .................. 340/431, 340/438, 425.5, 458, 447; 307/10.8
See application file for complete search history.

(56) References Cited

U.S. PATENT DOCUMENTS

| | | | |
|---|---|---|---|
| 3,821,560 A | 6/1974 | Hansen | |
| 3,821,669 A | 6/1974 | Wuerffel | |
| 3,840,852 A | 10/1974 | Schwellenbach | |
| 3,965,456 A | 6/1976 | Schwellenbach | |
| 4,620,109 A | 10/1986 | Kummer | |
| 4,809,177 A | 2/1989 | Windle et al. | |
| 5,030,938 A * | 7/1991 | Bondzeit | 340/431 |
| 5,157,376 A * | 10/1992 | Dietz et al. | 340/458 |
| 5,285,113 A | 2/1994 | Schlich | |
| 5,397,924 A | 3/1995 | Gee et al. | |
| 5,491,383 A | 2/1996 | Leiber et al. | |
| 5,596,233 A | 1/1997 | Leiber et al. | |
| 5,693,985 A | 12/1997 | Gee et al. | |
| 5,719,552 A | 2/1998 | Thompson | |
| 5,805,061 A | 9/1998 | Fritz et al. | |
| 6,069,559 A | 5/2000 | Davis et al. | |
| 6,130,487 A | 10/2000 | Bertalan et al. | |
| 6,218,952 B1 * | 4/2001 | Borland et al. | 340/641 |
| 6,501,376 B2 | 12/2002 | Dieckmann et al. | |
| 6,525,654 B1 * | 2/2003 | Siggers | 340/438 |
| 6,535,113 B1 * | 3/2003 | Gravolin | 340/431 |
| 6,642,628 B2 | 11/2003 | Burdick et al. | |
| 6,788,195 B1 * | 9/2004 | Stegman et al. | 340/458 |
| 6,909,363 B2 | 6/2005 | Bell et al. | |
| 7,052,031 B2 | 5/2006 | Gravolin | |
| 7,064,658 B2 | 6/2006 | Burlak et al. | |
| 7,106,182 B2 | 9/2006 | De Wilde | |
| 7,113,078 B2 * | 9/2006 | Young | 340/431 |

(Continued)

OTHER PUBLICATIONS http://www.centrevilletrailer.com/news-notices/surgebrake-troubleshootingtips.htm; "Surge Brake Troubleshooting Tips", pp. 1-6 (Aug. 2, 2007).

Primary Examiner—Phung Nguyen
(74) Attorney, Agent, or Firm—Harness, Dickey & Pierce, P.L.C.

(57) ABSTRACT

A method of determining whether an electronic component on a trailer is functioning from within a passenger compartment of a vehicle having an electrical connection with the trailer generally includes determining a first electronic component configuration associated with the trailer and determining an electrical load profile for a terminal in the electrical connection between the vehicle and the trailer based on the first electronic component configuration of the trailer. The method also includes associating the electronic component on the trailer with the electrical load profile for the terminal in the electrical connection and monitoring a value descriptive of an electrical load at the terminal in the electrical connection. The method further includes informing a user in the passenger compartment that the electronic component is not functioning when the value is less than a threshold value.

20 Claims, 8 Drawing Sheets

U.S. PATENT DOCUMENTS 7,339,465 B1 * 3/2008 Cheng et al. ................ 340/514
2004/0160123 A1    8/2004 Burdick et al.
2005/0017856 A1    1/2005 Peterson
2005/0275288 A1    12/2005 Miller

* cited by examiner

Custom Trailer Light Information Entry

File  Edit  View  Insert  Format  Tools  Data  Window  Contribute  Help

Trailer Custom #4

| | 320 | Active | Not Active |
|---|---|---|---|
| 1 | Terminal — 310 | | |
| 2 | Right Light$_1$ = 2w — 312 | X | |
| 3 | Right Light$_2$ = 2w — 314 | | X |
| 4 | Right Light3 = 2.5w — 316 | | X |
| 5 | Right Light$_4$ = 2.5w | | X |
| 6 | Right Light$_5$ = 2w | | X |
| 7 | 328 — 318 | | |
| 8 | Terminal — 322 | | |
| 9 | Left turn light$_1$ = 2w — 324 | x | |
| 10 | Left turn light2 = 2w — 326 | | x |
| 11 | Left turn light$_3$ = 4w | | x |

Custom Trailer Light Information Entry

File  Edit  View  Insert  Format  Tools  Data  Window  Contribute  Help

Trailer Custom #4

| | A | Active | Not Active |
|---|---|---|---|
| 1 | Automatic — 342 | | x |
| 2 | Class I - rated to 2000 lbs. — 344 | X | |
| 3 | Class II - rated to 3500 lbs. — 346 | | x |
| 4 | Class III - rated to 5000 lbs. — 348 | | x |
| 5 | Class IV - rated to 10,000 lbs. | | x |
| 6 | | | |
| 7 | | | |
| 8 | | | |
| 9 | | | |
| 10 | | | |
| 11 | | | |

METHOD AND APPARATUS FOR ADJUSTING TRAILER ELECTRICAL LOAD LIMITS

The present teachings relate to an electrical connection between a trailer and a vehicle and more particularly relate to a customizable configuration of electronic components on the trailer that can be monitored from within a passenger compartment of the vehicle.

BACKGROUND

Typically, two people are required to confirm that all of the exterior lighting on the trailer works correctly. A first person is within the passenger compartment and activates the lights on the vehicle, which in turn activate the respective lights on the trailer. A second person walks around the perimeter of the trailer to confirm that each of the lights on the vehicle are activating the respective lights on the trailer. By walking around the trailer and individually identifying each of the lights, the second person who is outside of the vehicle is able to communicate to the first person inside the vehicle which lights on the trailer are not illuminated.

SUMMARY

The present teachings generally include a method of determining whether an electronic component on a trailer is functioning from within a passenger compartment of a vehicle having an electrical connection with the trailer. The method generally includes determining a first electronic component configuration associated with the trailer and determining an electrical load profile for a terminal in the electrical connection between the vehicle and the trailer based on the first electronic component configuration of the trailer. The method also includes associating the electronic component on the trailer with the electrical load profile for the terminal in the electrical connection and monitoring a value descriptive of an electrical load at the terminal in the electrical connection. The method further includes informing a user in the passenger compartment that the electronic component is not functioning when the value is less than a threshold value.

Further areas of applicability will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

DETAILED DESCRIPTION

The following description is merely exemplary in nature and is not intended to limit the present teachings, their application or uses. It should be understood that throughout the drawings, corresponding reference numerals can indicate like or corresponding parts and features. As used herein, the term module, control module, component and/or device can refer to one or more of the following: an application specific integrated circuit (ASIC), an electronic circuit, a processor (shared, dedicated or group) and memory that executes one or more software or firmware programs, a combinational logic circuit and/or other suitable mechanical, electrical or electro-mechanical components that can provide the described functionality and/or one or more combinations thereof.

Moreover, certain terminology can be used for the purpose of reference only and need not limit the present teachings. For example, terms such as "upper," "lower," "above" and "below" can refer to directions in the drawings to which reference is made. Terms such as "front," "back," "rear," and "side" can describe the orientation of portions of the component within a consistent but arbitrary frame of reference which can be made more clear by reference to the text and the associated drawings describing the component under discussion. Such terminology may include the words specifically mentioned above, derivates thereof and words of similar import. Similarly, the terms "first," "second" and other such numerical terms referring to structures, systems and/or methods do not imply a sequence or order unless clearly indicated by the context.

Figure 1:
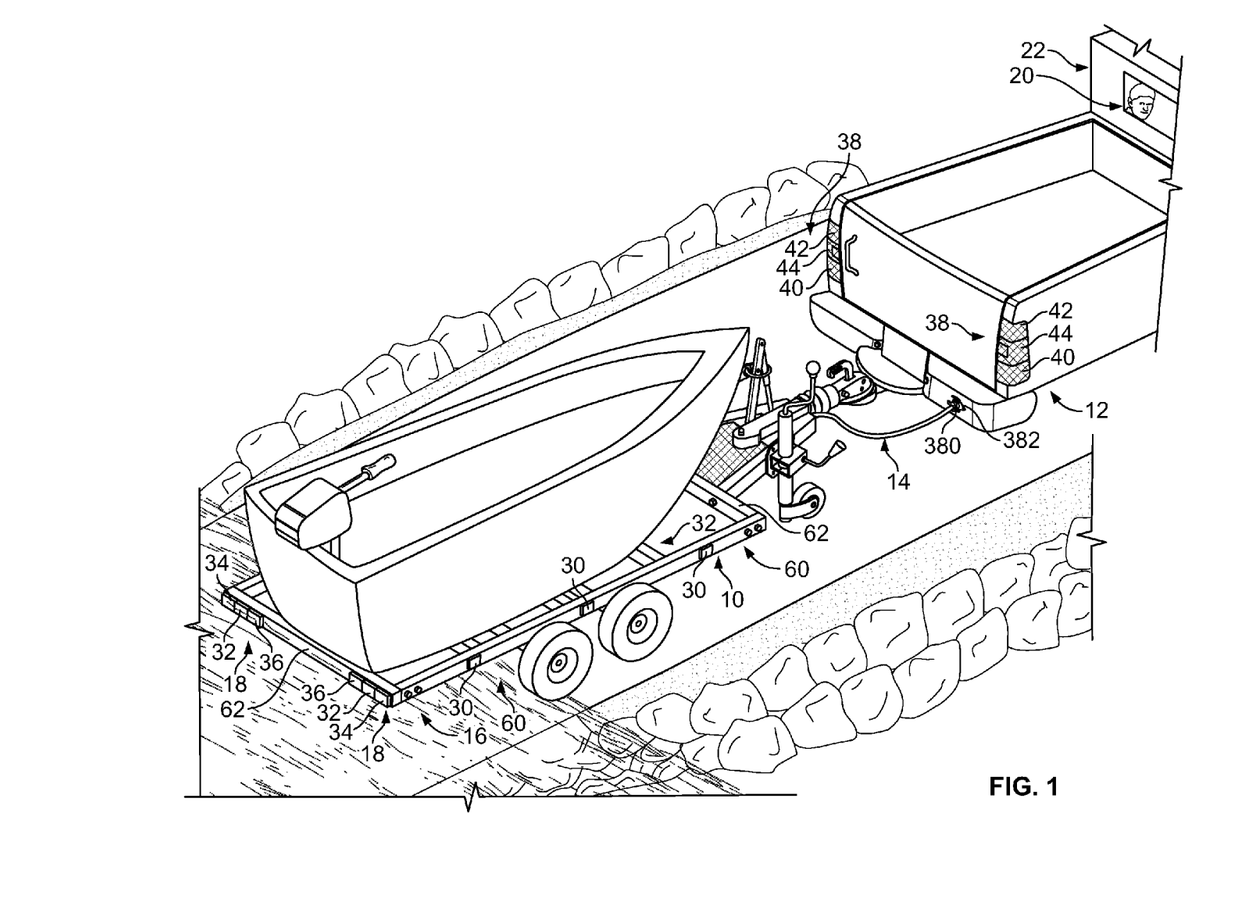
FIG. 1 is a perspective view of a trailer having a first electronic component configuration used to detect whether one or more electronic components are not functioning and inform a user in a passenger compartment of a vehicle in accordance with the present teachings.

With reference to FIG. 1, the present teachings generally include a trailer 10 that can be connected to a vehicle 12. An electrical connection 14 between the trailer 10 and the vehicle 12 can allow the vehicle 10 to detect one or more electrical loads of one or more electronic components on the trailer 10.

In one example, the trailer 10 can have a first electronic component configuration 16. By way of this example, the first electronic component configuration 16 can include multiple external lights 18 on the trailer 10 to which power can be supplied through the connection 14 between the trailer 10 and the vehicle 12. By monitoring the electrical connection 14 between the trailer 10 and the vehicle 12, it can be determined when one or more of the lights 18 on the trailer 10 are not illuminated and/or electronic components are not functioning. This can be done from within the vehicle 12 without the need for a user 20 to leave a passenger compartment 22 of the vehicle 12.

Based on an electrical profile that can be determined from the first electronic component configuration 16, it can be determined that a change in current level through one or more of the terminals of the electrical connection 14 can indicate that one or more of the external lights 18 and/or one or more other electronic components associated with the first electronic component configuration 16 is not functioning.

In FIG. 1, the trailer 10 is shown with the first electronic component configuration 16. It will be appreciated in light of the disclosure that the first electronic component configuration 16 can include one or more of the external lights 18, lights inside of the trailer 10, electric brakes, battery chargers, environmental controls (e.g., refrigeration) for the inside of the trailer 10, other suitable electronic components that can be powered through the electrical connection 14 and/or one or more combinations thereof. In this example, the first electronic component configuration 16 includes the external lights 18 that can include running lights 30, brake lights 32, tail lights 34 and turn lights 36. The trailer 10 can have the traditional pairs of running, turn and brake lights but the trailer 10 can also have multiple lights placed at various locations on the trailer 10 in accordance with the first electronic component configuration 16.

Each of the lights 18 on the trailer 10 can be powered through the electrical connection 14 to the vehicle 12. As such, the lights 18 on the trailer 10 are selectively illuminated and extinguished, as complimentary lights 38 on the vehicle 12 can do the same. The complimentary lights 38 of the vehicle 12 can include running lights 40, brake lights 42, tail lights 44 and turn lights 46. The vehicle 12 can also include additional lights, e.g., headlights 48 (FIG. 3) that do not have traditional complimentary lights 18 on the trailer 10. Notwithstanding the lack of the complimentary pair, the lights 18 on the trailer 10 can be configured to be illuminated and extinguished as the headlights 48 do the same, when applicable.

In accordance with the present teachings, the user 20 from within the passenger compartment 22 can determine whether any or all of the external lights 18 (and/or other electronic components) on the trailer 10 are not functioning while remaining in the passenger compartment 22. More specifically, a trailer tow module 50 (FIG. 3) can inform the user 20 that one or more of the external lights 18 are not illuminated and/or one or more electronic components on the trailer 10 are not functioning. In doing so, the trailer tow module 50 can determine a value descriptive of the electrical load through the electrical connection 14 between the trailer 10 and the vehicle 12. When the value descriptive of the electrical load (i.e., a value of a current level is below a threshold value), the trailer tow module 50 via a user module 52 (FIG. 3) can inform the user 20 in the passenger compartment 22 that one or more of the lights 18 are not illuminated and/or one or more electronic components on the trailer 10 are not functioning.

The trailer tow module 50 can determine an electrical profile for each of the lights 18 and/or each of the electronic components, as applicable. The electrical profile of each of the external lights 18 and/or each of the electronic components can include a power requirement for each of the external lights 18 and/or each of the electronic components of the trailer 10 as defined in the first electronic component configuration 16. As such, a predicted electrical load on one or more of the terminals in the electrical connection 14 can be based on the power requirement for each of the external lights 18 and/or each of the electronic components. When a measured electrical load through one or more of the terminals (i.e., the electrical load determined by the trailer tow module 50), is less than the predicted electrical load (i.e., below the threshold value) based on the first electronic component configuration, the trailer tow module 50 can inform the user 20 within the passenger compartment 22 that one or more of the lights 18 are not illuminated and/or one or more of the electronic components are not functioning.

Figure 2:
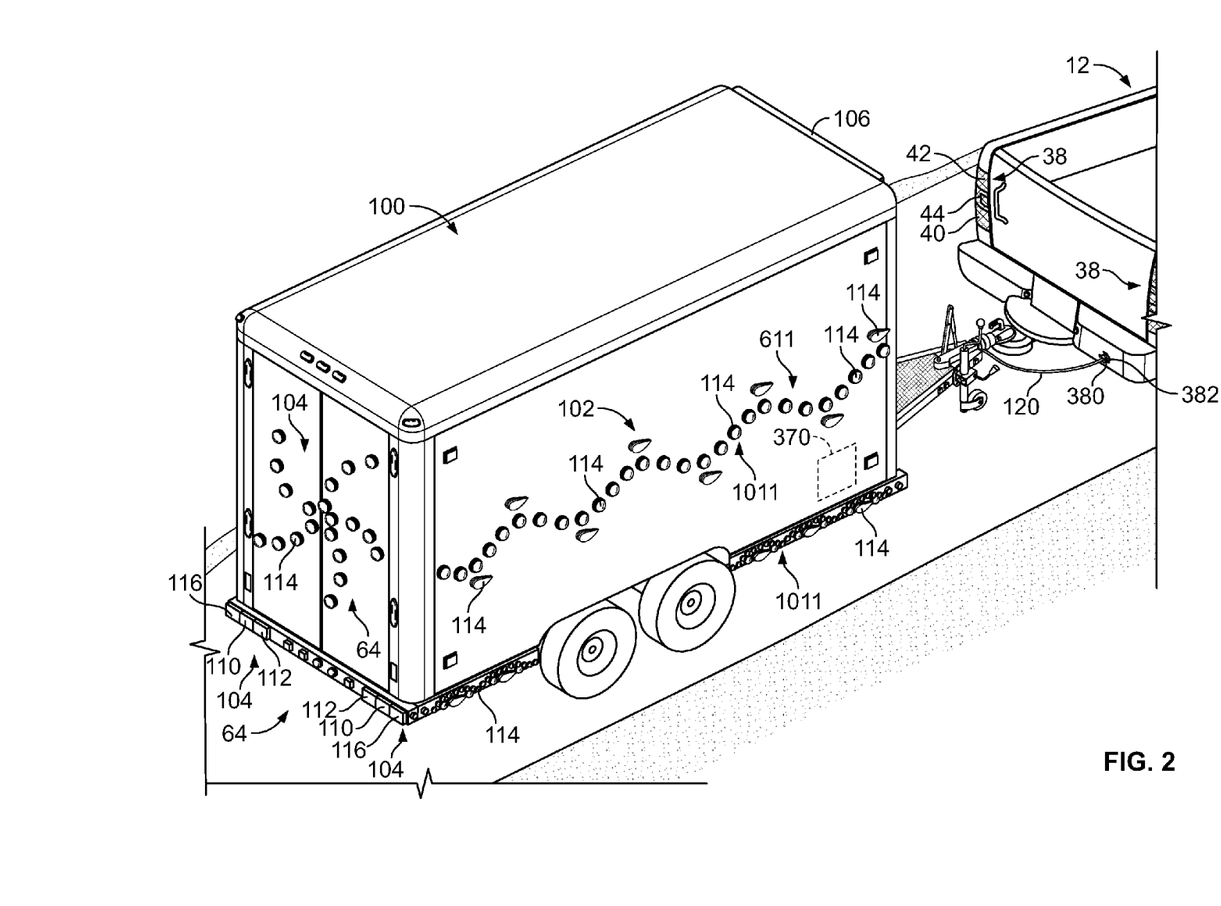
FIG. 2 is a perspective view of another example of a trailer with a second electronic component configuration connected to the vehicle in accordance with the present teachings.

In the example illustrated in FIG. 1, placement of one or more of the external lights 18 on the trailer 10 can be in a pattern 60 that can be generally disposed along a body 62 of the trailer 10. In contrast to the pattern 60 in FIG. 1, a pattern 64 of lights as shown in the example of FIG. 2 can be a more complex arrangement that can populate many of the external surfaces of a trailer 100. In one example, the pattern 62 can be implemented by the user 20 after the trailer is fabricated, i.e., the pattern 62 need not be an original equipment manufacturer installation.

Figure 3:
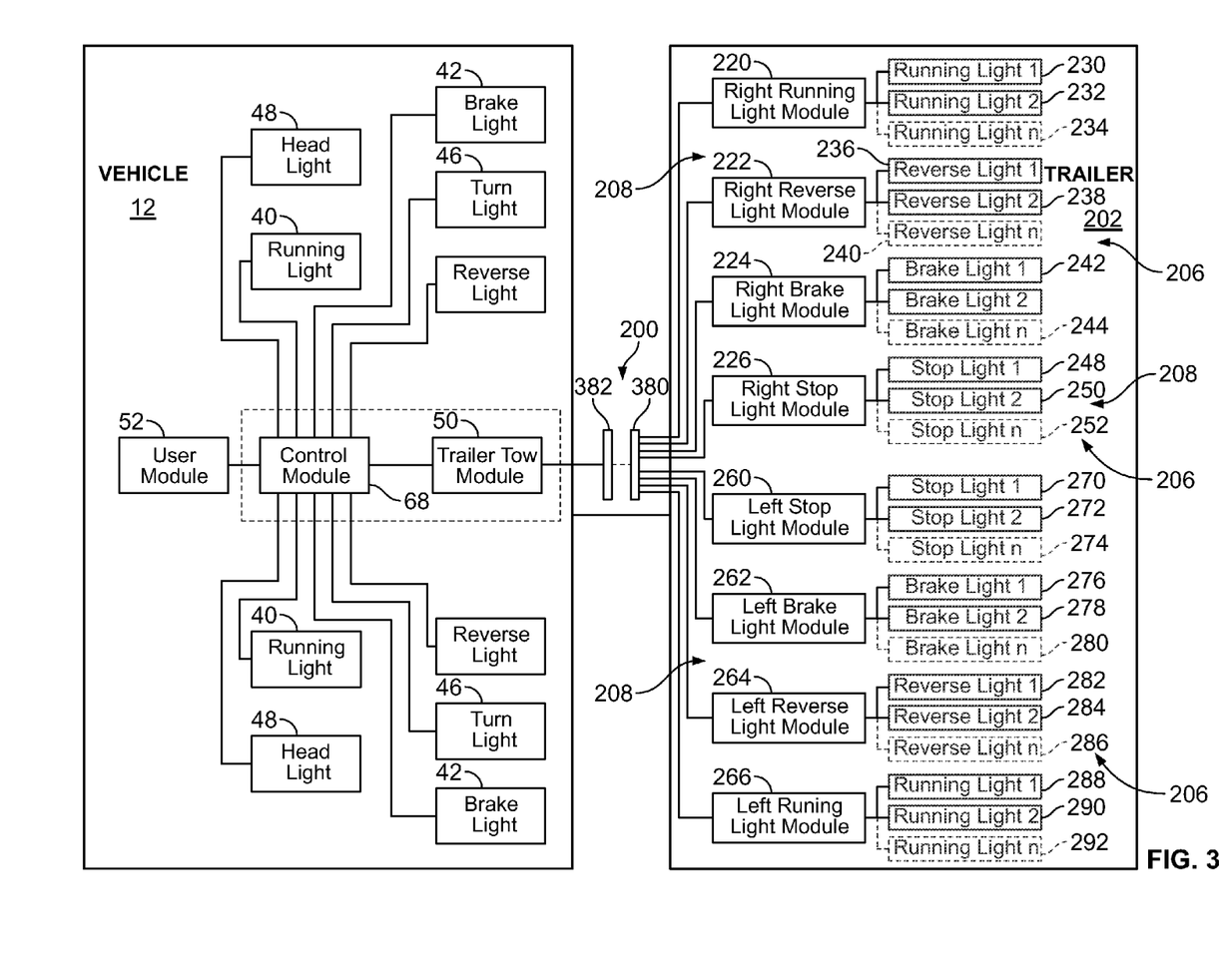
FIG. 3 is a diagram of a vehicle having a trailer tow module that is connected to a trailer having a third electronic component configuration in accordance with the present teachings.

It will be appreciated in light of the disclosure that the ability of the trailer tow module 50 to determine whether one or more of the lights 18 are not illuminated and/or one or more of the electronic components are not functioning is not limited by the selection of any pattern of the external lights 18 on the trailer 10. With reference to FIG. 3, it will also be appreciated in light of the disclosure that the trailer tow module 50 can be a separate module in the vehicle 202 or can be part of a control module 68 that can control other features, systems, etc. of the vehicle 202. As such, communication to and from the trailer tow module 50 can be directly from the trailer tow module 50 and/or through the control module 68.

In another example and with reference to FIG. 2, the trailer 100 is shown having a second electronic component configuration 102 in accordance with the present teachings. The second electronic component configuration 102 can include one or more external lights 104 and/or one or more electronic components on the trailer 100. The one or more of the electronic components can include lights inside of the trailer 10, electric brakes, battery chargers, an environmental module 106 (e.g., refrigeration) for the inside of the trailer 10, other suitable electronic components that can be powered through the electrical connection 14 and/or one or more combinations thereof.

The external lights 104 can include one or more brake lights 110, turn lights 112 and multiple running lights 114. Through an electrical connection 120 between the vehicle 12 and the trailer 100, the user 20 (FIG. 1) in the vehicle 12 can determine whether one or more of the lights 104 on the trailer 100 are not illuminated and/or one or more electronic components are not functioning without the need to exit the passenger compartment 22 (FIG. 1). Similar to the trailer 10 and vehicle 12 illustrated in FIG. 1, the lights 104 on the trailer 100 can be powered through an electrical connection 120 connected to the vehicle 12. As such, the lights 104 on the trailer 100 are illuminated and extinguished, as the complimentary lights 38 on the vehicle 12 can do the same. As noted above, the complimentary lights 38 of the vehicle 12 can include running lights 40, brake lights 42, tail lights 44 and turn lights 46.

The trailer tow module 50 (FIG. 3) can determine whether one or more of the lights 104 and/or other electronic components on the trailer 100 are functioning similarly to the trailer 10. As such, the trailer tow module 50 can connect to one of the suitable trailers 10, 100 to inform the user 20 within the vehicle 12 whether one or more electronic components associated with the respective electronic component configuration 16, 102 are (or are not) functioning without the need for the user 20 to leave the passenger compartments 22.

Figure 8:
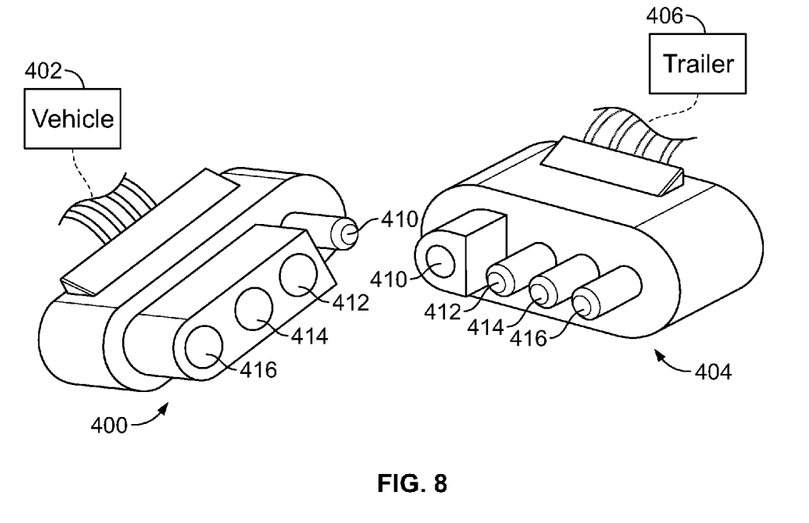
FIG. 8 is a partial perspective view of an exemplary connector that establishes an electrical connection between the trailer and the vehicle having a four terminal configuration in accordance with the present teachings.

In one example and with reference to FIG. 3, the trailer tow module 50 can monitor the electrical load (i.e., a current draw) across each of the terminals that form the electrical connection 200 between the trailer 202 and the vehicle 12. It will be appreciated in light of the disclosure that the electrical connection 200 can have various configurations of terminals 204, e.g., four terminals (FIG. 8), five terminals (FIG. 9), six terminals (FIG. 10), seven terminals (FIG. 11), etc. When one or more lights 206 on the trailer 202 powered through the electrical connection 200 is not illuminated due to damage, exposure to the elements, etc., the electrical load (i.e., current level) can decrease across the terminal through which power would have been delivered to one or more non-functioning lights, as discussed herein.

The third electronic component configuration 208 for the trailer 202 can include a right running light module 220, a right reverse light module 222, right brake light module 224 and a right stop light module 226. The right running light module 220 can connect the trailer tow module 50 to a first right running light 230, a second right running light 232 and additional right running lights 234 (illustrated in phantom line). The right reverse light module 222 can connect the trailer tow module 50 to a first right reverse light 236, a second right reverse light 238 and additional right reverse lights 240 (illustrated in phantom line). The right brake light module 224 can connect the trailer tow module 50 to a first right brake light 242, a second right brake light 244 and additional right brake lights 246 (illustrated in phantom line). The right stop light module 224 can connect the trailer tow module 50 to a first right stop light 248, a second right stop light 250 and additional right stop lights 252 (illustrated in phantom line).

The third electronic component configuration 208 for the trailer 202 can also include a left running light module 260, a left reverse light module 262, a left brake light module 264 and a left stop light module 266. The left running light module 260 can connect the trailer tow module 50 to a first left running light 270, a second left running light 272 and additional left running lights 274 (illustrated in phantom line). The left reverse light module 262 can connect the trailer tow module 50 to a first left reverse light 276, a second left reverse light 278 and additional left reverse lights 280 (illustrated in phantom line). The left brake light module 264 can connect the trailer tow module 50 to a first left brake light 282, a second left brake light 284 and additional left brake lights 286 (illustrated in phantom line). The left stop light module 264 can connect the trailer tow module 50 to a first left stop light 288, a second left stop light 290 and additional left stop lights 292 (illustrated in phantom line).

It will be appreciated in light of the disclosure that the additional lights, additional light modules and other additional electronic components can be connected to the trailer tow module 50 through the electrical connection 206. As such, the third electronic component configuration 208 can include the individual power requirements for each of the above mentioned lights 206 and any other lights and/or electronic components that can be added (and/or removed from) to the third electronic component configuration 208. In addition to the individual power requirements, the third electronic component configuration 208 can also include through which of the terminals 204 of the electrical connection 206 each of the above mentioned lights 206 and any other lights and/or electronic components are provided power.

By knowing the third electronic component configuration 208, the trailer tow module 50 can therefore determine the predicted electrical load for each of the one or more external lights 206 and/or one or more electronic components. The predicted electrical load for each of the one or more external lights 206 and/or one or more electronic components can be combined to establish an electrical profile for each of the terminals 204 in the electrical connection 200. In this regard, the electrical profile for each of the terminals 204 includes the total power requirements and thus predicted total electrical load for all of the one or more lights 206 and/or one or more electronic components on the trailer 202.

The trailer tow module 50 can thus determine that one or more of the lights 206 are not illuminated and/or one or more electrical components on the trailer 202 are not functioning, when the value descriptive of the electrical load (i.e., current level) through one or more of the terminals 204 in the electrical connection 200 is less than the threshold value. The threshold value is based on the expected (predicted) value of the electrical load determined from the electrical profile for each of the terminals 204 of the electrical connection 200.

Figure 4:
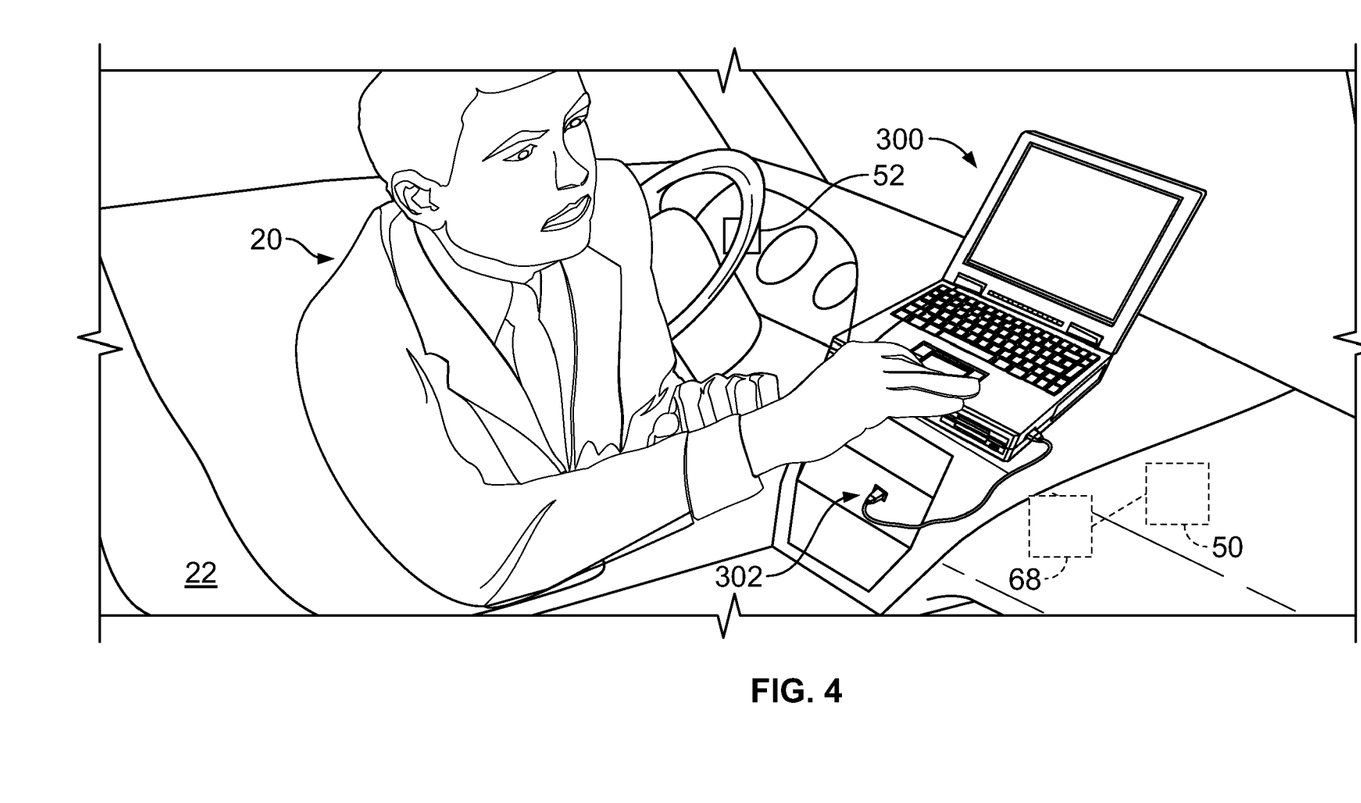
FIG. 4 is a diagram of a user in a vehicle customizing an electronic component configuration for one or more trailers in accordance with the present teachings.

With reference to FIG. 4, one or more of the electronic component configurations that are associated with the trailer tow module 50 can be customizable with input from the user 20. For example, the user 20 with a personal electronic device 300 can establish a suitable connection 302 (e.g., a universal serial bus (USB) connection) with the trailer tow module 50 while in the passenger compartment 22. In some instances, the trailer tow module 50 can confirm the connection 302 with the personal electronic device 300 via the user module 52. It will be appreciated in light of the disclosure that the user 20 can establish the connection 302 with the trailer tow module 50 in the passenger compartment 22 and/or at other suitable locations in and outside of the vehicle 12. Moreover, the user 20 with the personal electronic device 300 can also establish a wireless connection (in lieu of or in addition to the direct connection) to communicate with the trailer tow module 50 or with the control module 68. The personal electronic device 300 can be a personal computer, personal data assistant, a cellular phone, a dedicated device to communicate with the trailer tow module, etc.

Figure 5:
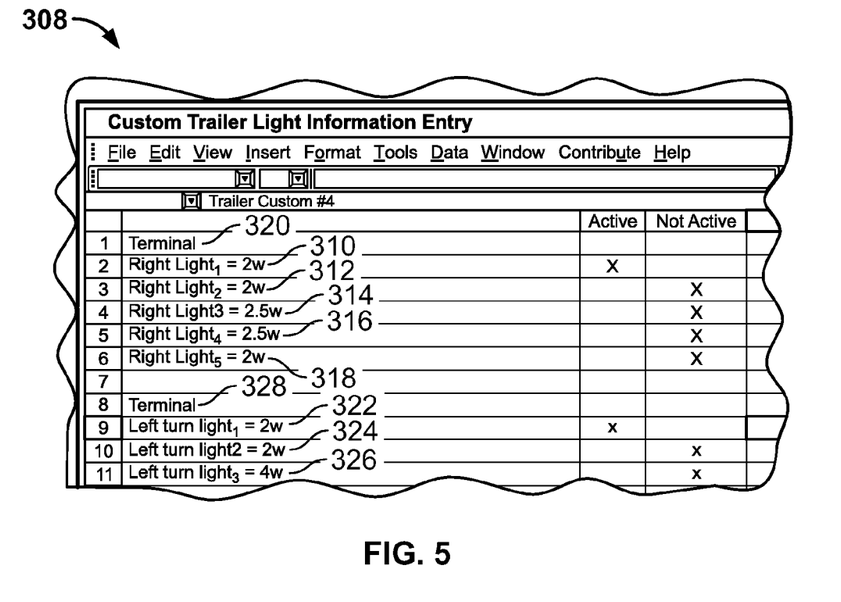
FIG. 5 is a diagram of a partial exemplary input template that can be used to program (or re-program) the trailer tow module with an individually customized electronic component configuration of a trailer in accordance with the present teachings.

The user 20 is able to provide information about the trailer 202 to compose a new (or re-configure an established) electronic component configuration associated with the trailer 202. In one example and with reference to FIG. 5, the user 20 (FIG. 4) can identify each electronic component and the terminal in the electrical connection 200 that provides power to that electrical component on an exemplary input template 308. By way of the above example, the user 20 can associate a first right running light 310, a second right running light 312, a third right running light 314, a fourth right running light 316 and a fifth right running light 318 with a first terminal 320. The user 20 can also associate a first left turn light 322, a second left turn light 324 and a third left turn light 326 with a second terminal 328.

In other examples, the user may set up four lights on one terminal of the electrical connection, six lights on a different terminal of the electrical connection and inform the trailer tow module via an input template the power requirements of the above lights. By way of this example, four five-watt bulbs can be connected to the first terminal of the connector, but two five-watt bulbs and four two and one half watt bulbs can be connected through the other terminal. It will be appreciated in light of the disclosure that the user can customize the lighting on the trailer and can upload to the trailer tow module the appropriate information so the trailer tow module knows exactly how many lights, the power requirement of each light, and through what terminal each light is connected when the trailer is connected to the vehicle.

Figure 6:
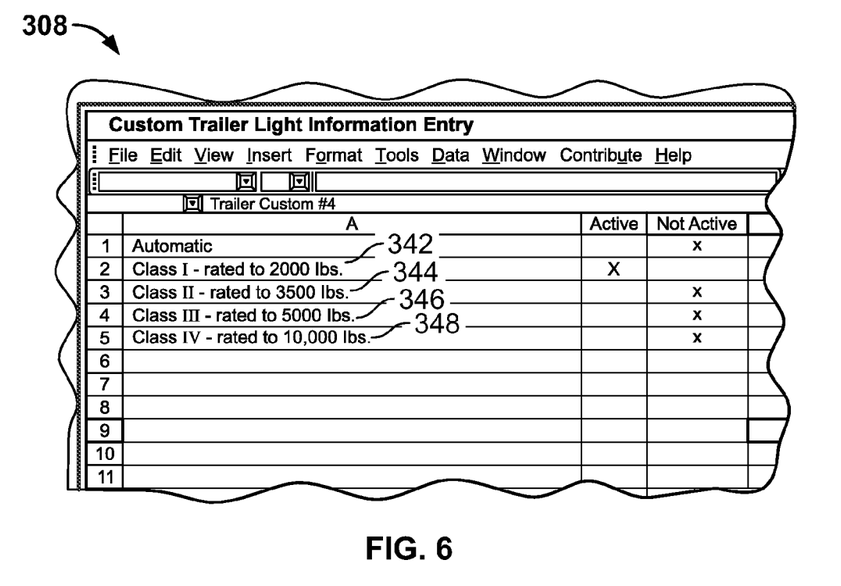
FIG. 6 is a diagram of another partial exemplary input template for an electronic component configuration based on a weight class of a trailer in accordance with the present teachings.

Without knowing the individual power requirements of the lights and/or other electronic components on the trailer, the user 20 is still able to compose a new (or re-configure an established) electronic component configuration by providing a weight and/or class of weight of the trailer 202. In one example and with reference to FIG. 6, the user 20 (FIG. 4) can identify the trailer class and/or the weight rating of the class. For example, the user 20 can choose to designate that the trailer 202 is a Class I Trailer—rated at 2000 lbs as indicated at 342. The user 20 can also choose to designate that the trailer 202 as a Class II Trailer—rated at 3500 lbs as indicated at 344, a Class III Trailer—rated at 5000 lbs as indicated at 346 or a Class IV Trailer—rated at 10,000 lbs as indicated at 346. The user can also designate automatic detection of the electronic component configuration of the trailer 202, as discussed herein.

Figure 7:
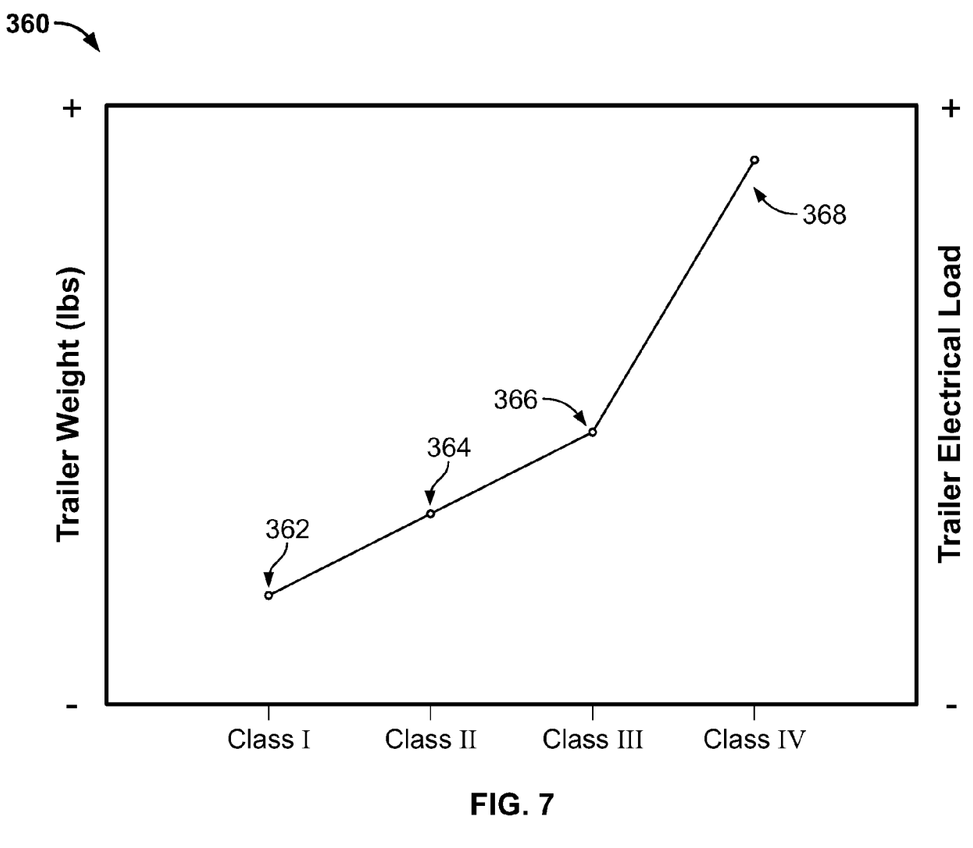
FIG. 7 is a diagram of a relationship between weight class ratings of a trailer, trailer gross weight ratings of the trailer and electrical load of the trailer in accordance with the present teachings.

As noted above, the power requirements for lights and/or other electronic components on the trailer 202 can be estimated based on the weight or the class of weight of the trailer. It will be appreciated in light of the disclosure that the weight of the trailer increases as the weight class of the trailer increases as shown in the diagram of FIG. 7 generally indicated by reference number 360. As shown, the weight of the trailer increases as the Class of trailer increases which in turn means the estimated electrical load by the lights and/or other electronic components on the trailer can increase accordingly. As such, trailer weight and/or trailer weight class can serve as proxy for the estimated electrical profile for the trailer, such as Class I at 362 can require less current draw than Class II at 364, Class III at 366 and Class IV at 368. Based on the class or weight designated, the trailer tow module can estimate the electrical profile for each of the terminals in the electrical connection 200 (FIG. 3).

As the user 20 wishes to further customize the electronic component configuration of the trailer tow module 50, the user 20 can input into the trailer tow module 50 more specifics about the lights 206 and/or other electronic components on the trailer 202. It will be appreciated in light of the disclosure that as more specifics are provided to the trailer tow module 50 about the number and power requirements of the lights and/or electronic components on the trailer 12, the determination by the trailer tow module 50 of whether the lights are illuminated and/or the electronic components are functioning can be more accurate.

The user 20 is, however, not required to enter any information about the trailer for the trailer tow module 50 to provide illumination information about the lights 208 on the trailer 202 to the user 20 in the passenger compartment 22. Notwithstanding, as the user 20 provides more information to the trailer tow module 50, it will be appreciated in light of the present disclosure the ability of the trailer tow module 50 to more accurately predict which of the lights 206 of the trailer 202 are not functioning can increase.

With reference to FIG. 2, the electronic component configuration 102 of the trailer 100 can also be automatically input via a wired or wireless connection between the trailer 100 and the vehicle 12. For example, the trailer 100 can include a radio frequency (RF) transceiver 370 that can be detected by the trailer tow module 50 (FIG. 3). The RF transceiver 370 (i.e., an RFID) can send information about the trailer 100 to the vehicle 12 so that the trailer tow module 50 can determine the electronic component configuration 102 for the trailer 100.

With reference to FIG. 1, the electrical connection 14 can be formed by a connecter 380 that can extend from the trailer 10 and a connector 382 that can extend from the vehicle 12. Each of those connectors 380, 382 can be implemented with various amounts of terminals and with various configurations as discussed herein. For example and with reference to FIG. 8, a connector 400 from a vehicle 402 can connect to a connecter 404 from a trailer 406. Each of the connectors 400, 404 can have four terminals: a first terminal 410, a second terminal 412, a third terminal 414 and a fourth terminal 416. In accordance with an electronic component configuration of the trailer 406, the first terminal 410 can provide for the control of the stop and turn lights on a left side of the trailer 406. The second terminal 412 can provide for the control of the stop and turn lights on a right side of the trailer 406. The third terminal 414 can provide for the running lights on the trailer 406. The fourth terminal 416 can provide ground.

Figure 9:
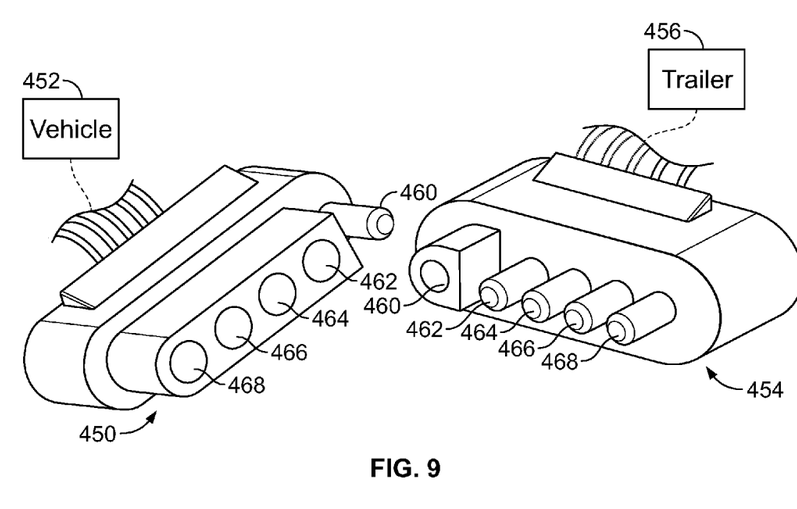
FIGS. 9, 10 and 11 are similar to FIG. 8 and are partial perspective views of exemplary connectors having a five, six and seven terminal configuration, respectively, in accordance with the present teachings.

With reference to FIG. 9, a connector 450 that connects to a vehicle 452 can connect to a connector 454 that connects to a trailer 456. Each of the connectors 450, 454 can include five terminals: a first terminal 460, a second terminal 462, a third terminal 464; a fourth terminal 466 and a fifth terminal 468. In accordance with an electronic component configuration of the trailer 456, the first terminal 460 can provide for the control of the stop and turn lights on the left side of the trailer 456. The second terminal 462 can provide for the control of the stop and turn lights on the right side of the trailer 456. The third terminal 464 can provide for the running lights on the trailer 456 such as tail lights, license lights and side marker lights. The fourth terminal 466 can provide ground. The fifth terminal 468 can provide auxiliary power. The fifth terminal 468 can be connected to a surge brake mechanism or other electronic components on the trailer 456.

Figure 10:
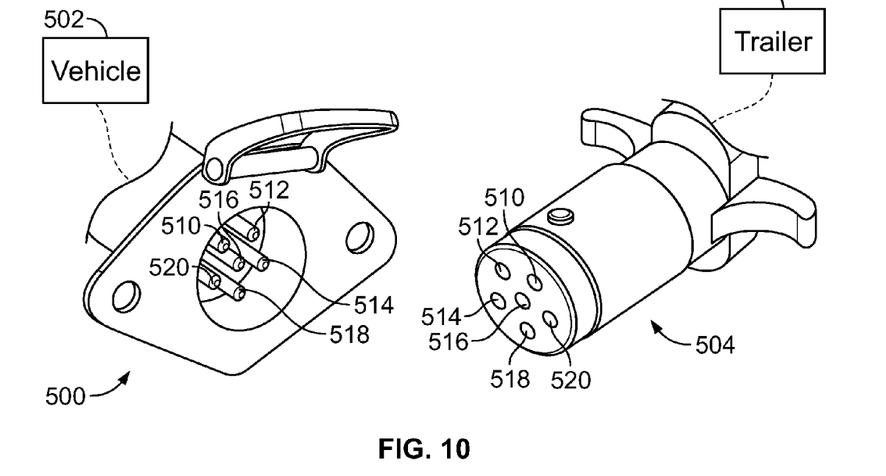

With reference to FIG. 10, a connector 500 can be connected to a vehicle 502 and can connect to a connector 504 that can be connected to a trailer 506. The connectors 500, 504 can have six terminals: a first terminal 510, a second terminal 512, a third terminal 514, a fourth terminal 516, fifth terminal 518 and a sixth terminal 520. In accordance with an electronic component configuration of the trailer 506, the first terminal 510 can provide for tail lights and/or brake lights. The second terminal 512 can provide a signal that can power an electric brake system on the trailer 506. A third terminal 514 can provide for a right turn signal on a trailer 506. A fourth terminal 516 can provide for an auxiliary 12-volt power source to the trailer 506. A fifth terminal 518 can provide for a left turn light on the trailer 506 and a sixth terminal 520 can provide for the ground.

Figure 11:
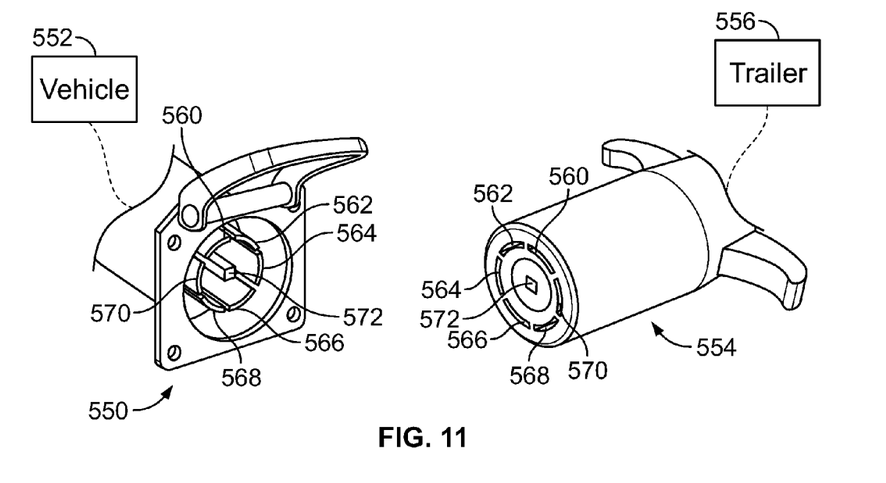

With reference to FIG. 11, a connector 550 can connect to a vehicle 552. A connector 554 can connect to a trailer 556. Each of the connectors 550, 554 can include seven terminals: a first terminal 560, a second terminal 562, a third terminal 564, a fourth terminal 566, a fifth terminal 568, a sixth terminal 570 and a seventh terminal 572. In accordance with an electronic component configuration of the trailer 556, the first terminal 560 can provide for a 12-volt auxiliary power source to the trailer 556. The second terminal 562 can provide for tail lights and/or brake lights on the trailer 556. The third terminal 564 can provide for a left turn light on the trailer 556. A fourth terminal 566 can provide a ground. A fifth terminal 568 can provide for optional electric brakes on the trailer 556. A sixth terminal 570 can provide for a right turn signal. A seventh terminal 572 can provide for the surge brake mechanism through which the reverse light signal can be sent to the trailer 556. The seventh terminal 572 can be used to power other electronic components. It will be appreciated in light of the disclosure that the electronic component configurations associated with the trailer tow module 50 can be configured (and re-configured) so that the electrical profile for any of the lights above and/or electronic components can be implemented with the trailer and the electrical connection with the vehicle.

While specific aspects have been described in this specification and illustrated in the drawings, it will be understood by those skilled in the art that various changes can be made and equivalents can be substituted for elements thereof without departing from the scope of the present teachings, as defined in the claims. Furthermore, the mixing and matching of features, elements and/or functions between various aspects of the present teachings may be expressly contemplated herein so that one skilled in the art will appreciate from the present teachings that features, elements and/or functions of one aspect of the present teachings may be incorporated into another aspect, as appropriate, unless described otherwise above. Moreover, many modifications may be made to adapt a particular situation, configuration or material to the present teachings without departing from the essential scope thereof. Therefore, it is intended that the present teachings not be limited to the particular aspects illustrated by the drawings and described in the specification as the best mode presently contemplated for carrying out the present teachings but that the scope of the present teachings will include many aspects and examples following within the foregoing description and the appended claims.

What is claimed is:

1. A method of determining whether an electronic component on a trailer is functioning from within a passenger compartment of a vehicle having an electrical connection with the trailer, the method comprising:
    determining a first electronic component configuration associated with the trailer;
    determining an electrical load profile for a terminal in the electrical connection between the vehicle and the trailer based on the first electronic component configuration of the trailer;
    associating the electronic component on the trailer with the electrical load profile for the terminal in the electrical connection;
    monitoring a value descriptive of an electrical load at the terminal in the electrical connection;
    informing a user in the passenger compartment that the electronic component is not functioning when the value is less than a threshold value.

2. The method of claim 1, wherein determining the first electronic component configuration includes determining a weight of the trailer and assigning an electrical profile to the terminal based on the weight of the trailer and wherein said electrical profile of the terminal includes the threshold value.

3. The method of claim 1, wherein determining the first electronic component configuration includes determining a trailer class of the trailer and assigning an electrical profile to the terminal based on the trailer class of the trailer and wherein said electrical profile of the terminal includes the threshold value.

4. The method of claim 1, wherein determining the first electronic component configuration includes receiving a signal from the trailer and assigning an electrical profile to the terminal based on the signal from the trailer and wherein said electrical profile of the terminal includes the threshold value.

5. The method of claim 4, wherein said signal is from a radio frequency identification device.

6. The method of claim 1, wherein determining the first electronic component configuration includes inputting a customized electronic component configuration via a user module within the vehicle.

7. The method of claim 1, wherein determining the first electronic component configuration includes inputting a customized electronic component configuration via a universal serial bus connection with the vehicle.

8. The method of claim 1, wherein the first electronic component includes a plurality of lights connected to a plurality of surfaces of the trailer and organized in a pattern viewable from outside of the trailer.

9. The method of claim 1, wherein determining the electrical load profile includes identifying a power requirement of each electrical component and the terminal associated with power delivery therefor.

10. A method of determining whether a light on a trailer is illuminated from within a passenger compartment of a vehicle having an electrical connection with the trailer, the method comprising:
    determining a first light configuration associated with the trailer;
    determining an electrical load profile for a terminal in the electrical connection between the vehicle and the trailer based on the first light configuration of the trailer, wherein the electrical profile for the terminal includes at least a power requirement for the light on the trailer and the terminal associated with the power delivery therefor;
    monitoring a level of current at the terminal in the electrical connection;
    informing a user in the passenger compartment that the light is not illuminated when the level of current at the terminal is less than a threshold current level.

11. The method of claim 10, wherein determining the first light configuration includes determining a weight of the trailer and assigning an electrical profile to the terminal based on the weight of the trailer and wherein said electrical profile of the terminal includes the threshold value.

12. The method of claim 10, wherein determining the first light configuration includes determining a trailer class of the trailer and assigning an electrical profile to the terminal based on the trailer class of the trailer and wherein said electrical profile of the terminal includes the threshold value.

13. The method of claim 10, wherein determining the first light configuration includes receiving a signal from the trailer and assigning an electrical profile to the terminal based on the signal from the trailer and wherein said electrical profile of the terminal includes the threshold value.

14. The method of claim 13, wherein said signal is from a radio frequency identification device.

15. The method of claim 10, wherein determining the first light configuration includes inputting a customized light configuration via a user module within the vehicle.

16. The method of claim 10, wherein determining the first light configuration includes inputting a customized light configuration via a universal serial bus connection with the vehicle.

17. A device for determining whether a light on a trailer is illuminated from within a passenger compartment of a vehicle having an electrical connection with the trailer, the device comprising:
    a trailer tow module that determines a first light configuration associated with the trailer;
    a terminal in the electrical connection between the trailer and the vehicle,
    wherein said trailer tow module determines an electrical load profile for said terminal based on said first light configuration of the trailer,
    wherein the electrical profile for the terminal includes at least a power requirement for the light on the trailer and the terminal associated with the power delivery therefor
    wherein said trailer tow module monitors a level of current at said terminal in the electrical connection and
    wherein said trailer tow module informs a user in the passenger compartment that the light is not illuminated when the level of current at the terminal is less than a threshold current level.

18. The device of claim 17, wherein said trailer tow module receives a signal from the trailer and assigns an electrical profile to said terminal based on said signal from the trailer and wherein said electrical profile of the terminal includes the threshold current level.

19. The device of claim 17, wherein said trailer tow module receives a customized light configuration via a user module within the vehicle.

20. The device of claim 17, further comprising a universal serial bus connection with said trailer tow module through which said first light configuration is adjusted.

\* \* \* \* \*